United States Patent
Kim

(10) Patent No.: US 7,776,750 B2
(45) Date of Patent: Aug. 17, 2010

(54) SEMICONDUCTOR DEVICE AND METHOD FOR FORMING A PATTERN IN THE SAME WITH DOUBLE EXPOSURE TECHNOLOGY

(75) Inventor: Seo Min Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 601 days.

(21) Appl. No.: 11/768,726

(22) Filed: Jun. 26, 2007

(65) Prior Publication Data
US 2008/0153299 A1     Jun. 26, 2008

(30) Foreign Application Priority Data
Dec. 22, 2006  (KR)  .................. 10-2006-0132598

(51) Int. Cl.
*H01L 21/311*  (2006.01)
(52) U.S. Cl. .............. 438/703; 438/736; 257/E21.035
(58) Field of Classification Search ............... 438/703, 438/736; 257/E21.035
See application file for complete search history.

(56) References Cited

U.S. PATENT DOCUMENTS

| | | | |
|---|---|---|---|
| 6,184,151 B1 * | 2/2001 | Adair et al. ................. | 438/736 |
| 6,238,850 B1 * | 5/2001 | Bula et al. .................. | 430/394 |
| 6,485,895 B1 * | 11/2002 | Choi et al. ................... | 430/330 |
| 7,151,040 B2 * | 12/2006 | Tran et al. ................... | 438/401 |
| 7,211,519 B2 * | 5/2007 | Takigawa et al. ............ | 438/736 |
| 7,361,454 B2 * | 4/2008 | Kobayashi .................. | 430/313 |
| 7,655,568 B2 * | 2/2010 | Lee et al. .................... | 438/695 |
| 2007/0154837 A1 | 7/2007 | Lee et al. | |
| 2007/0154838 A1 | 7/2007 | Lee | |

FOREIGN PATENT DOCUMENTS

| KR | 1997-0077456 | 12/1997 |
|---|---|---|
| KR | 2004-0002237 | 1/2004 |

OTHER PUBLICATIONS

Korean Intellectual Property Office Notice of Rejection for Application No. 10-2006-0132598, dated Jan. 10, 2008 (Abstract Only).

* cited by examiner

*Primary Examiner*—W. David Coleman
*Assistant Examiner*—Sun M Kim
(74) *Attorney, Agent, or Firm*—Marshall, Gerstein & Borun LLP

(57) ABSTRACT

A method for forming a pattern in a semiconductor device includes performing a double exposure process for a multifunctional hard mask layer over a semiconductor substrate using a line/space mask to form a multifunctional hard mask layer pattern having a first contact hole region. The multifunctional hard mask layer pattern is subjected to a resist flow process to form a multifunctional hard mask layer pattern having a second contact hole region with rounded edges, where the size of the second contact hole region is smaller than that of the first contact hole region.

13 Claims, 9 Drawing Sheets

(i)

(ii)

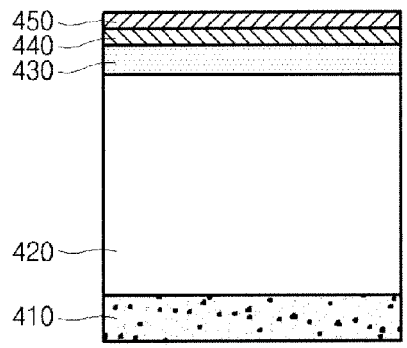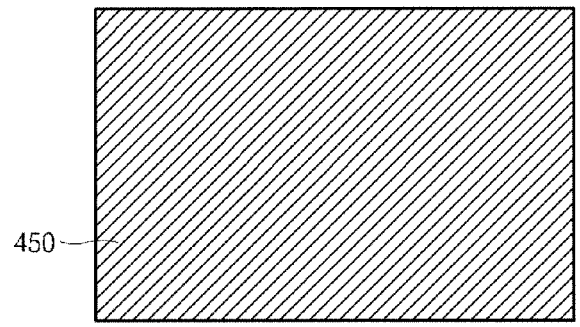
Fig.4a
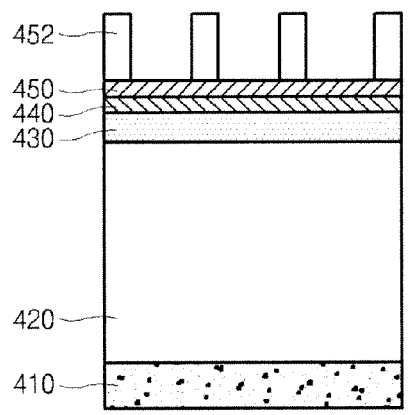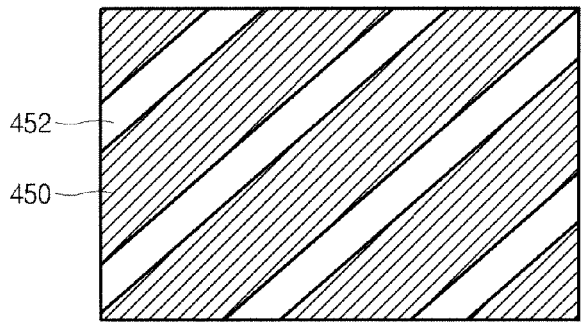
Fig.4b

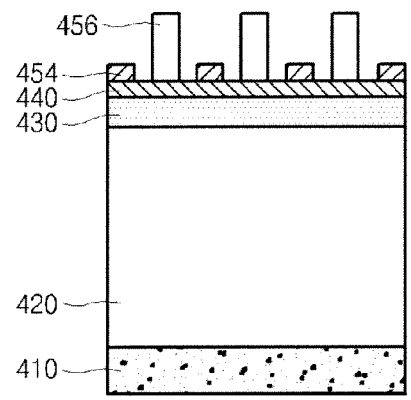 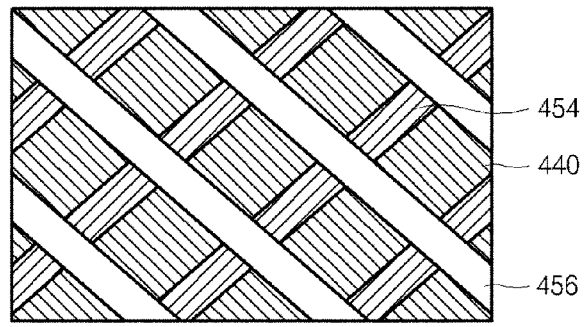
(i) (ii)
Fig.4c
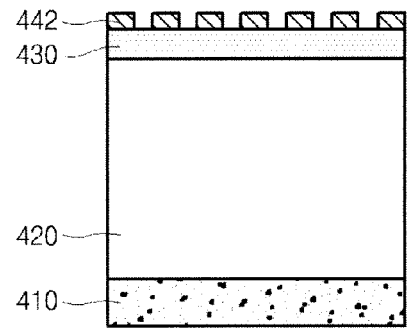 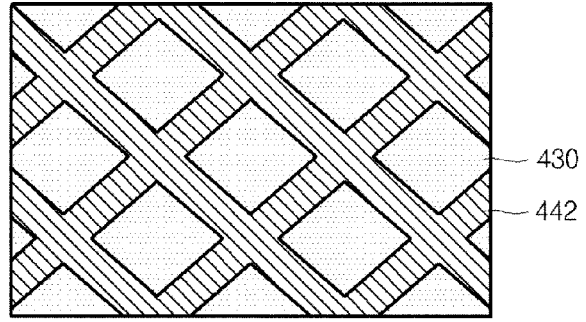
(i) (ii)
Fig.4d

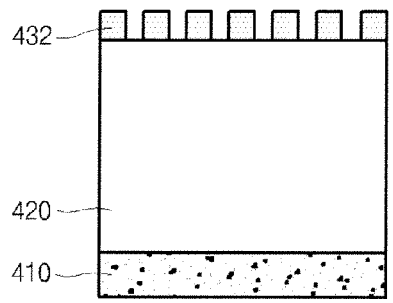 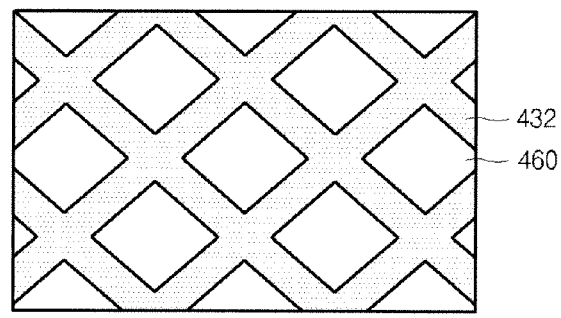
(i)            (ii)
Fig.4e
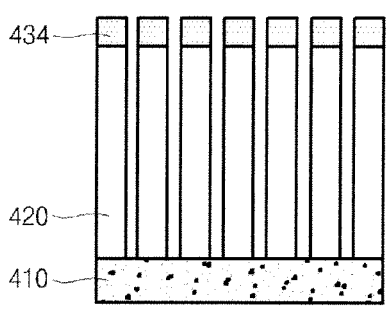 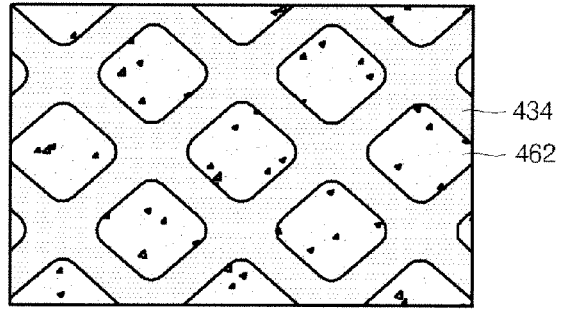
(i)            (ii)
Fig.4f

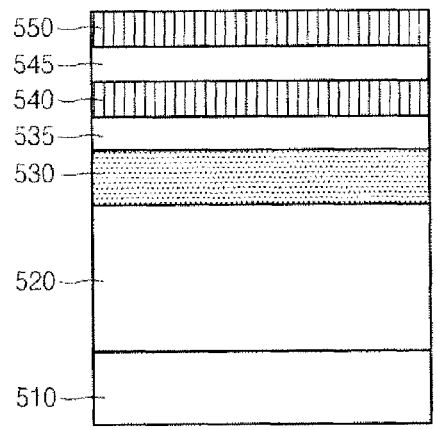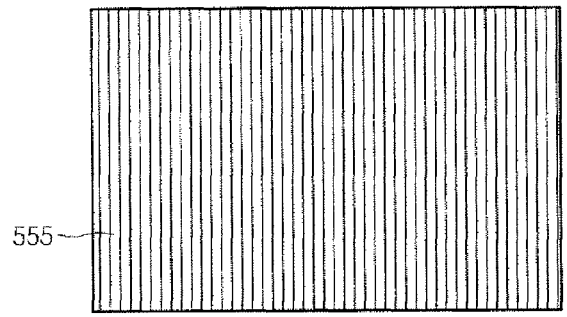
(i) (ii)
Fig.5a
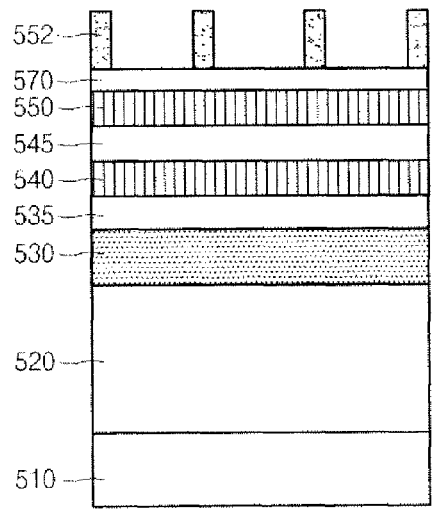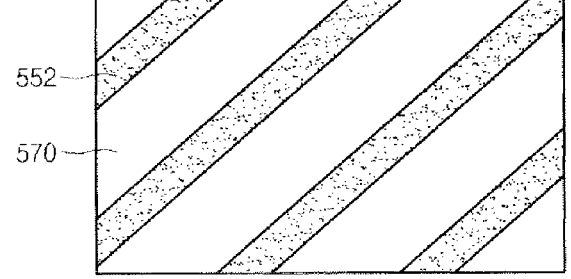
(i) (ii)
Fig.5b

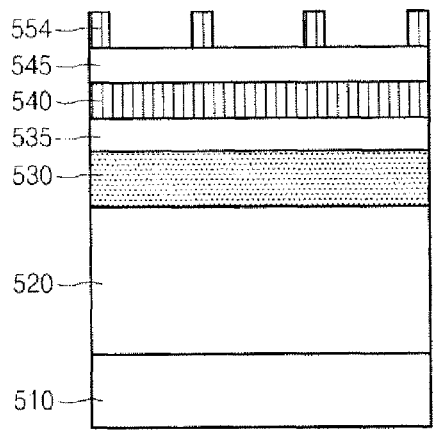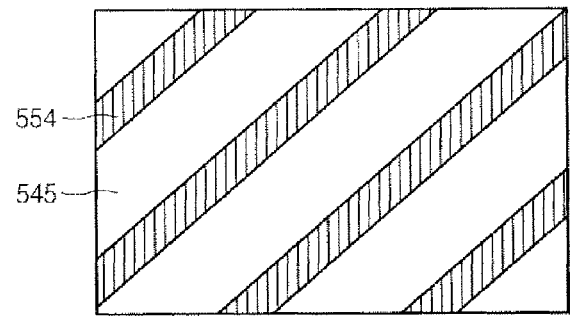
(i) (ii)
Fig.5c
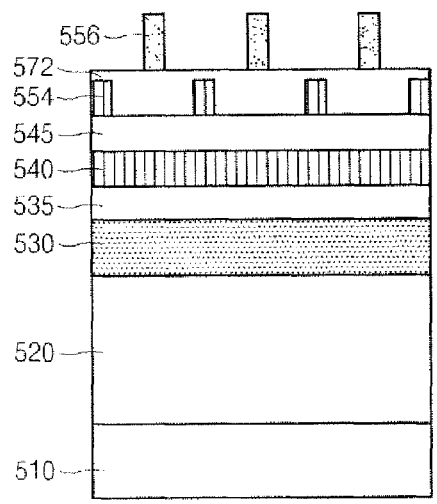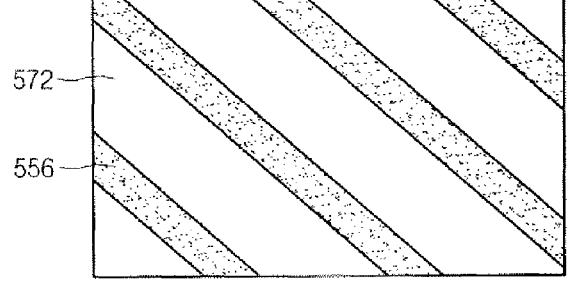
(i) (ii)
Fig.5d

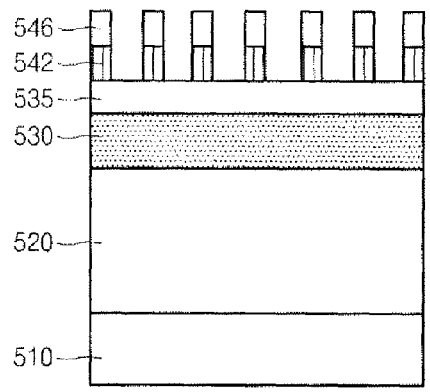
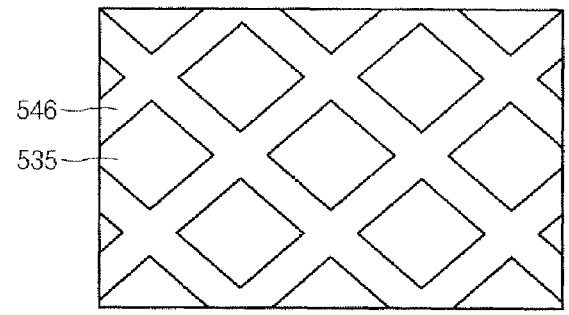
(i)           (ii)
Fig.5e
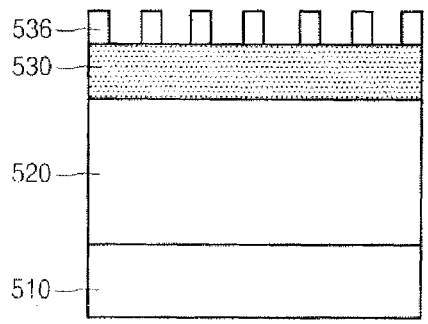
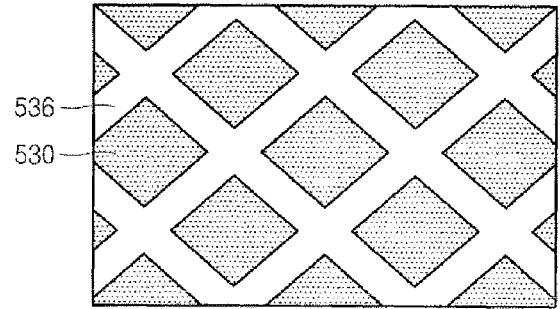
(i)           (ii)
Fig.5f

SEMICONDUCTOR DEVICE AND METHOD FOR FORMING A PATTERN IN THE SAME WITH DOUBLE EXPOSURE TECHNOLOGY

CROSS-REFERENCE TO RELATED APPLICATION

Priority to Korean patent application number 10-2006-0132598, filed on Dec. 22, 2006, the disclosure of which is incorporated by reference in its entirety, is claimed.

BACKGROUND OF THE INVENTION

The invention relates to a memory device. More particularly, the invention relates to double exposure technology and a method for forming a pattern in a semiconductor device using the same.

In general, a semiconductor device such as dynamic random access memory ("DRAM") includes numerous fine patterns. Such patterns are formed through a photolithography process. In order to form a pattern by the photolithography process, a photoresist ("PR") film is coated over a target layer to be patterned. Next, a conventional exposure process is performed to change the solubility of a given portion of the PR film. Subsequently, a developing process is performed to form a PR pattern exposing the target layer. That is, the PR pattern is formed by removing the portion having an altered solubility, or the portion having an unaltered solubility. Then, the exposed target layer is etched using the PR pattern, and the PR pattern is subsequently stripped to form a target layer pattern.

In the photolithography process, resolution and depth of focus ("DOF") are two important issues. Resolution (R) can be expressed by Equation 1 below.

$$R = k_1 \frac{\lambda}{NA}, \quad (1)$$

where $k_1$ is a constant determined by the type and thickness of the PR film, $\lambda$ is the wavelength of the light source, and NA is the numerical aperture of the exposure equipment.

According to Equation 1, the shorter the wavelength ($\lambda$) of the light source and the larger the NA of the exposure equipment, the finer the pattern that is formed over a wafer. However, the wavelength ($\lambda$) of the light source being used and the NA of the exposure equipment have not kept abreast of advances in the level of integration in semiconductor devices. Therefore, resolution enhancement technology ("RET") for improving resolution and DOF is applied by incorporating diverse methods. For example, RET technology includes using a phase shift mask ("PSM"), off-axis illumination ("OAI") optical proximity correction ("OPC"), and the like. Additionally, there is a technology called double exposure technique ("DET") capable of forming a fine pattern over a wafer. Critical dimension (CD) uniformity in the DET depends on the overall overlay accuracy of a first exposure mask and a second exposure mask.

As the design rules of semiconductor devices shrink, it becomes more difficult to form a fine contact hole due to limitations of the exposure apparatus and the photoresist material. A resist flow process may be an alternative solution to overcome such difficulties. The resist flow process is a technique for forming a contact hole beyond the resolution limit of the exposure apparatus. First, the resist flow process includes patterning a first contact hole with a polymer photoresist through a photolithography process. Afterwards, the photoresist is reheated to a temperature above the glass transition temperature $T_g$ and undergoes thermal flow to form a second contact hole smaller than the first contact hole.

In the method for forming patterns in the semiconductor device employing double exposure technology, the process margin is poor. In addition, the device failure may occur due to the Mask Error Factor ("MEF").

BRIEF SUMMARY OF THE INVENTION

Embodiments of the invention are directed to an improved method for forming a pattern in a semiconductor device. According to one embodiment of the invention, the improved method for forming a pattern in a semiconductor device utilizes double exposure technology and a resist flow method.

According to an embodiment of the invention, a method for forming a pattern in a semiconductor device includes: forming an insulating film over a semiconductor substrate, forming a multifunctional hard mask layer over the insulating film, forming a first hard mask layer and a second hard mask layer over the multifunctional hard mask layer, selectively etching the second hard mask layer to form a second hard mask layer pattern, etching the first hard mask layer using a mask to form a first hard mask layer pattern, wherein the mask intersects the second hard mask layer pattern on a plane, removing the second hard mask layer pattern, etching the multifunctional hard mask using the first hard mask layer pattern as an etching mask to form a multifunctional hard mask layer pattern, removing the first hard mask layer pattern, performing a resist flow process on the multifunctional hard mask layer pattern, thereby forming a contact hole pattern, and patterning the semiconductor substrate using the contact hole pattern as an etching mask to form a contact hole.

According to another embodiment, a semiconductor device is provided that has contact holes formed according to the method for forming a pattern described above.

BRIEF DESCRIPTION OF THE DRAWINGS

FIGS. 2 and 3 are layouts of an exposure mask in accordance with double exposure technology;

FIGS. 4*a* to 4*f* illustrate a method for forming a pattern in a semiconductor device according to an embodiment of the invention; and FIGS. 5*a* to 5*h* illustrate a method for forming a pattern in a semiconductor device according to another embodiment of the invention.

DESCRIPTION OF THE EMBODIMENTS

The invention relates to an improved exposure method. The improved exposure method includes performing a double exposure process for a multifunctional hard mask layer over a semiconductor substrate using a line/space mask to form a multifunctional hard mask layer pattern having a first contact hole region. The multifunctional hard mask layer pattern is performed by a resist flow process to form the multifunctional hard mask layer pattern having a second contact hole region with rounded edges, where the size of the second contact hole region is smaller than the size of the first contact hole region.

Figure 1:
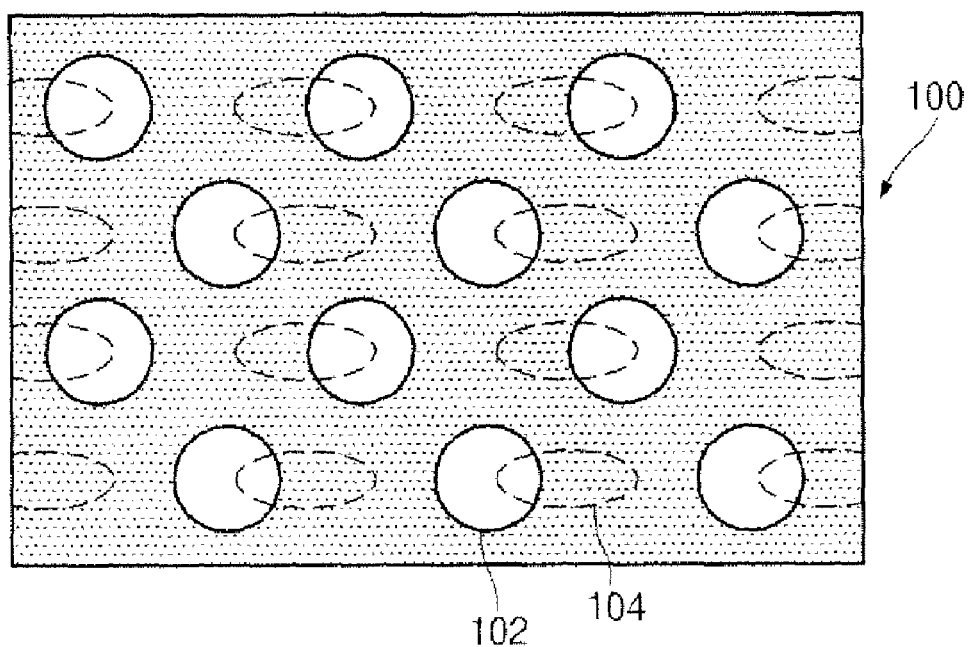
FIG. 1 is a layout of an exposure mask.

FIG. 1 is a layout of an exposure mask 100. The exposure mask 100 includes a capacitor region 102 and a storage node contact plug region 104. The capacitor region 102 is holed. The storage node contact plug region 104 is overlapped with a portion of the capacitor region 102 to form an electrical connection. As the size of the semiconductor device shrinks, a hole pattern for the capacitor region 102 needs to be smaller than the hole pattern that a conventional exposure apparatus can provide. As a result, double exposure technology is used.

Figure 2:
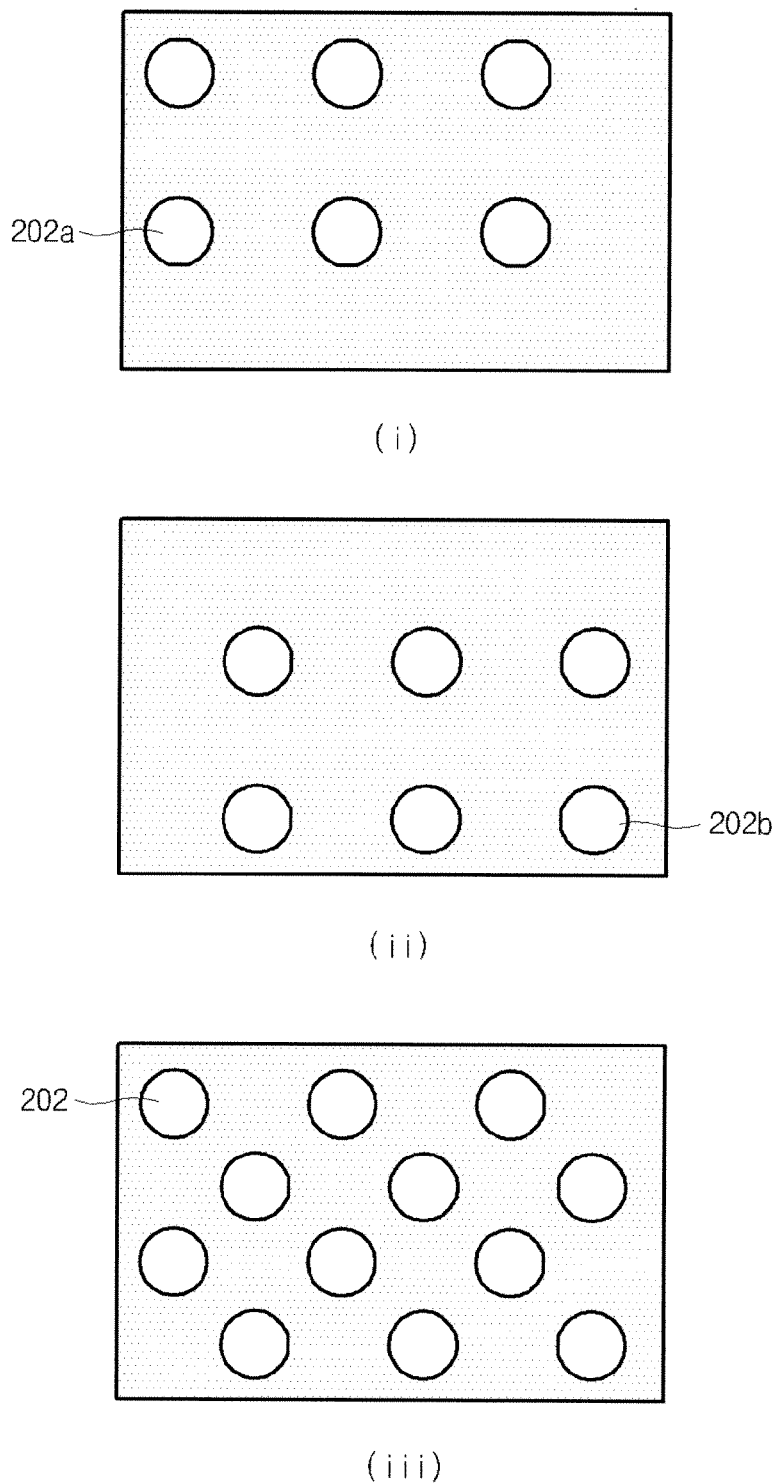

FIGS. 2 and 3 are layouts of an exposure mask using double exposure technology. Referring to FIG. 2, a contact hole pattern defining a capacitor region 202 can be divided into two parts 202a, 202b to form a double pitch. Accordingly, the small contact hole pattern can easily be formed. Referring to FIG. 3, a contact hole pattern defining a capacitor region 302 is formed by a double exposure technology using two line/space-type layouts intersecting each other on a plane. Accordingly, a method for forming a pattern in a semiconductor device according to one embodiment of the invention can increase the processing margin. In addition, the effect on an adjacent storage node contact region may be minimized when a lower electrode is formed, compared with the method for forming a pattern in a semiconductor device using double exposure technology.

FIGS. 4a to 4f illustrate a method for forming a pattern in a semiconductor device according to an embodiment of the invention. FIGS. 4a(i) to 4f(i) are cross-sectional views taken along line I-I' of FIG. 3, and FIGS. 4a(ii) to 4f(ii) are top views. An insulating film 420 for forming the capacitor region 302 shown in FIG. 3 is formed over a semiconductor substrate 410 having a given lower structure such as a device isolation structure (not shown), a gate structure (not shown), a bit line (not shown), and a bit line contact plug (not shown). A multifunctional hard mask layer 430, a first hard mask layer 440, and a second hard mask layer 450 are formed over the insulating film 420.

According to one embodiment of the invention, the insulating film 420 is formed of an oxide film. In addition, the multifunctional hard mask layer 430 is formed of a polymer material such as a photoresist film or an antireflective coating film for a subsequent resist flow process. In another embodiment of the invention, the multifunctional hard mask layer 430 is a compound containing a large quantity of silicon, but it is not limited to such a compound. In addition, the multifunctional hard mask layer 430 can be formed using compounds disclosed in KR Application number 10-2006-0000115 of Hynix Semiconductor Inc., filed Jan. 2, 2006, KR Application number 10-2005-0135357 of Hynix Semiconductor Inc., filed Dec. 30, 2006, KR Application number 10-2005-0135270 of Hynix Semiconductor Inc., filed Dec. 30, 2005, KR Application number 10-2005-0058205 of Hynix Semiconductor Inc., filed Jun. 30, 2005, KR Application number 10-2005-0058198 of Hynix Semiconductor Inc., filed Jun. 30, 2005, and KR Application number 10-2005-0058193 of Hynix Semiconductor Inc., filed Jun. 30, 2005, the relevant disclosures of which are incorporated by reference.

According to another embodiment of the invention, the first hard mask layer 440 and the second hard mask layer 450 are formed of a polysilicon film or a silicon oxynitride (SiON) film to serve as a hard mask for the double patterning process. In addition, the first hard mask layer 440 and the second hard mask layer 450 can be formed of different materials with a specified difference in etch selectivity so that the first hard mask layer 440 and the second hard mask layer 450 cannot be etched at the same time. Optionally, a bottom antireflective coating (BARC) can be formed between the first hard mask layer 440 and the second hard mask layer 450.

Referring to FIGS. 4b to 4d, a first photoresist film (not shown) is formed over the second hard mask layer 450. The first photoresist film is exposed and developed using a mask formed by the layout of FIG. 3(i) to form a first photoresist pattern 452. The second hard mask layer 450 is etched using the first photoresist pattern 452 as an etching mask to form a second hard mask layer pattern 454. The first photoresist pattern 452 is removed. A second photoresist film (not shown) is formed over the first hard mask layer 440 including the second hard mask layer pattern 454. The second photoresist film is exposed and developed using a mask formed by the layout of FIG. 3(ii) to form a second photoresist pattern 456. The first hard mask layer 440 is etched using the second photoresist pattern 456 and the second hard mask layer pattern 454 as an etching mask to form a first hard mask layer pattern 442. The second photoresist pattern 456 and the second hard mask layer pattern 454 are removed.

According to one embodiment of the invention, the first photoresist pattern 452 is formed with line/space patterns spaced apart from each other by a given interval. Also, the second photoresist pattern 456 is Formed with line/space patterns spaced apart from each other by a given interval. As shown in FIG. 4c(ii), the second photoresist pattern 456 perpendicularly intersects the second hard mask layer pattern 454 corresponding to the first photoresist pattern 452 on a plane. In addition, the first hard mask layer pattern 442 defines a plurality of capacitor regions 302 as shown in FIG. 3(iii). According to another embodiment of the invention, the first photoresist pattern 452 and the second photoresist pattern 456 may be formed in such a manner that a portion of or all of the line/space patterns is curved to increase the amount of resist flow in the subsequent process.

Referring to FIGS. 4d to 4f, the multifunctional hard mask layer 430 is etched using the first hard mask layer pattern 442 as an etching mask to form a multifunctional hard mask layer pattern 432 defining a first contact hole region 460. The multifunctional hard mask layer pattern 432 is subjected to a thermal process to form a multifunctional hard mask layer pattern 434 defining a second contact hole region 462. The insulating film 420 is etched using the multifunctional hard mask layer pattern 434 as an etching mask to form a contact hole defining a capacitor region.

According to one embodiment of the invention, the second contact hole region 462 is formed with rounded edges. The size of the second contact hole region 462 is smaller than that of the first contact hole region 460. In addition, the multifunctional hard mask layer pattern 432 is formed of a polymer material for use in a resist flow process. In the resist flow process, the multifunctional hard mask layer pattern 432 is heated to reach its glass transition temperature $T_g$, which results in resist flow, thereby forming the multifunctional hard mask layer pattern 434 with rounded edges.

Figure 5G:
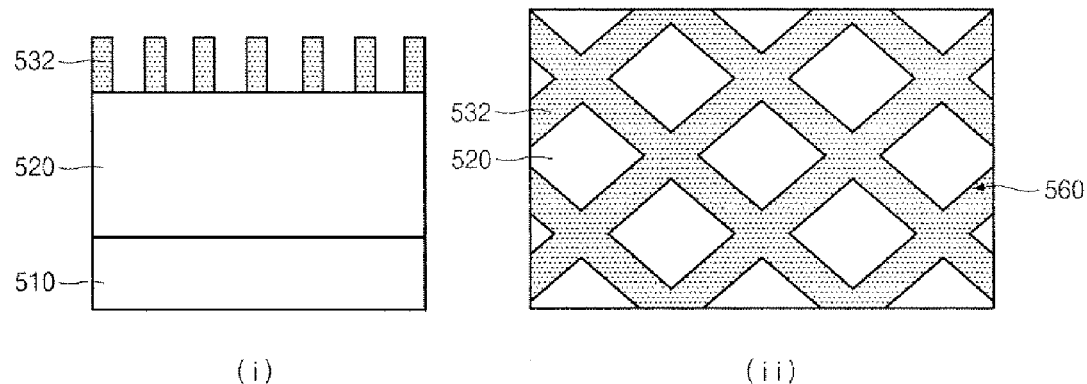

FIGS. 5a to 5h illustrate a method for forming a pattern in a semiconductor device according to another embodiment of the invention. FIGS. 5a(i) to 5h(i) are cross-sectional views taken along line I-I' of FIG. 3, and FIGS. 5a(ii) to 5h(ii) are top views. In order to form the capacitor region 302 of FIG. 3, an insulating film 520 is formed over a semiconductor substrate 510 including a given lower structure such as a device isolation structure (not shown), a gate structure (not shown), a bit line (not shown), and a bit line contact plug (not shown). A multifunctional hard mask layer 530, a first hard mask layer 535, a second hard mask layer 540, a third hard mask layer 545, and a fourth hard mask layer 550 are formed over the insulating film 520.

According to one embodiment of the invention, the insulating film 520 is formed of an oxide film. In addition, the multifunctional hard mask layer 530 is formed of a polymer material such as a photoresist film or an antireflective coating film for the subsequent resist flow process. According to another embodiment of the invention, the first hard mask layer 535 and the third hard mask layer 545 are formed of an SiON film. The second hard mask layer 540 and the fourth hard mask layer 550 are preferably formed of a polysilicon layer. The third hard mask layer 545 serves as a barrier film between the polysilicon layers.

Referring to FIGS. 5b and 5c, a bottom anti-reflective coating ("BARC") film 570 and a first photoresist film (not shown) are formed over the fourth hard mask layer 550. The first photoresist film is exposed and developed using a mask formed by the layout of FIG. 3(i) to form a first photoresist pattern 552. The BARC film 570 and the fourth hard mask layer 550 are etched using the first photoresist pattern 552 to form a fourth hard mask layer pattern 554. The first photoresist pattern 552 and the BARC film 570 are removed.

According to one embodiment of the invention, the first photoresist pattern 552 is formed with line/space patterns spaced apart from each other by a given interval. In addition, the first photoresist pattern 552 may be formed in such a manner that a portion of or all of the line/space patterns is curved to increase the amount of resist flow in the subsequent process.

Referring to FIGS. 5d and 5e, a BARC film 572 is formed over the semiconductor substrate 510. A second photoresist film (not shown) is formed over the BARC film 572. The second photoresist film is exposed and developed by using a mask formed by the layout of FIG. 3(ii) to form a second photoresist pattern 556. The third hard mask layer 545 is etched by using the second photoresist pattern 556 and the fourth hard mask layer pattern 554 as an etching mask to form a third hard mask layer pattern 546. The second photoresist pattern 556, the BARC film 572, and the fourth hard mask layer pattern 554 are removed. The second hard mask layer 540 is etched using the third hard mask layer pattern 546 as an etching mask to form a second hard mask layer pattern 542.

According to one embodiment of the invention, the second photoresist pattern 556 is formed with line/space patterns spaced apart from each other by a given interval. In addition, the third hard mask layer pattern 546 defines a plurality of capacitor regions 302 of FIG. 3(iii). According to another embodiment of the invention, the second photoresist pattern 556 may be formed in such a manner that a portion of or all of the line/space patterns is curved to increase the amount of resist flow in the subsequent process.

Figure 5H:
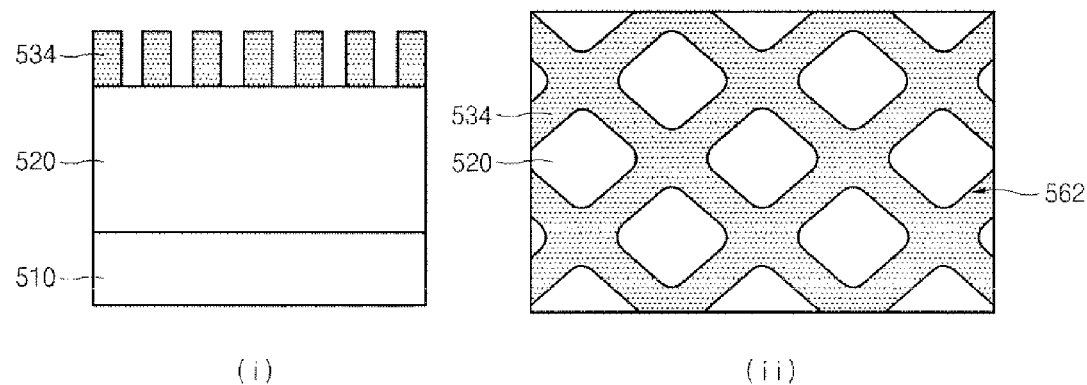

Referring to FIGS. 5f to 5h, the third hard mask layer pattern 546 is removed. The first hard mask layer 535 is etched by using the second hard mask layer pattern 542 as an etching mask to form a first hard mask layer pattern 536. The multifunctional hard mask layer 530 is etched using the first hard mask layer pattern 536 as an etching mask to form a multifunctional hard mask layer pattern 532 defining a first contact hole region 560. The second hard mask layer pattern 542 and the first hard mask layer pattern 536 are removed. The multifunctional hard mask layer pattern 532 is subjected to a resist flow process to form a multifunctional hard mask layer pattern 534 defining a second contact hole region 562.

According to one embodiment of the invention, the second contact hole region 562 is formed with rounded edges. The size of the second contact hole region 562 is smaller than that of the first contact hole region 560. In addition, the multifunctional hard mask layer pattern 532 is formed of a polymer material such as a photoresist film or a BARC film for the resist flow process. In the resist flow process, the multifunctional hard mask layer pattern 532 is heated to reach its glass transition temperature $T_g$, which results in resist flow, thereby forming the multifunctional hard mask layer pattern 534 with rounded edges. The insulating film 520 is etched by using the multifunctional hard mask layer pattern 534 as an etching mask to form a contact hole defining a capacitor region.

As described above, with the semiconductor device and the pattern formation method for the same, it is possible to secure a sufficient process margin. In addition, since the contact hole patterns with rounded edges are formed by using the resist flow process, it is possible to improve the yield and the reliability of the device.

The above embodiments of the invention are illustrative and not limiting. Various alternatives and equivalents are possible. The invention is not limited by the lithography steps described herein, nor is the invention limited to any specific type of semiconductor device. For example, the invention may be implemented in a dynamic random access memory (DRAM) device or non volatile memory device. Other additions, subtractions, or modifications that are obvious in view of the present disclosure are intended to fall within the scope of the appended claims.

What is claimed is:

1. A method for forming a pattern in a semiconductor device, the method comprising:
    forming an insulating film over a semiconductor substrate;
    forming a multifunctional hard mask layer over the insulating film;
    forming a first hard mask layer and a second hard mask layer over the multifunctional hard mask layer;
    selectively etching the second hard mask layer to form a second hard mask layer pattern;
    etching the first hard mask layer using a mask and the second hard mask layer pattern to form a first hard mask layer pattern, wherein the mask intersects the second hard mask layer pattern on a plane;
    removing the second hard mask layer pattern;
    etching the multifunctional hard mask layer using the first hard mask layer pattern as an etching mask to form a multifunctional hard mask layer pattern;
    removing the first hard mask layer pattern;
    performing a resist flow process on the multifunctional hard mask layer pattern, thereby forming a contact hole pattern; and
    patterning the insulating film using the contact hole pattern as an etching mask to form a contact hole.

2. The method of claim 1, wherein the step of selectively etching the second hard mask layer to form the second hard mask layer pattern comprises:
    forming a photoresist film over the second hard mask layer;
    exposing and developing the photoresist film using a line/space mask to form a photoresist pattern; and
    etching the second hard mask layer using the photoresist pattern as an etching mask to form the second hard mask layer pattern.

3. The method of claim 2, wherein the line/space mask is partially curved.

4. The method of claim 2, wherein the line/space mask is completely curved.

5. The method of claim 1, wherein the step of etching the first hard mask layer to form the first hard mask layer pattern comprises:
    forming a photoresist film over the first hard mask layer including the second hard mask layer pattern;
    exposing and developing the photoresist film using a mask to form a photoresist pattern, wherein the mask intersects the second hard mask layer pattern on a plane; and
    etching the first hard mask layer using the photoresist pattern and the second hard mask layer pattern as an etching mask to form the first hard mask layer pattern.

6. The method of claim 1, wherein the first hard mask layer and the second hard mask layer comprise materials having different etch selectivity.

7. The method of claim 6, wherein one of the first hard mask layer and the second hard mask layer comprises a polysilicon layer and the other comprises a silicon oxynitride (SiON) film.

8. The method of claim 1, further comprising forming a silicon oxynitride (SiON) film between the first hard mask layer and the second hard mask layer.

9. The method of claim 8, wherein the first hard mask layer and the second hard mask layer comprise a polysilicon layer.

10. The method of claim 1, further comprising forming a bottom antireflective coating ("BARC") film between the first hard mask layer and the second hard mask layer.

11. The method of claim 1, wherein the multifunctional hard mask layer comprises a resist flow polymer material.

12. The method of claim 1, comprising forming the contact hole in a capacitor region.

13. A semiconductor device comprising the contact holes formed according to the method of claim 1.

* * * * *